United States Patent [19]
Kobayashi

[11] Patent Number: 5,243,191
[45] Date of Patent: Sep. 7, 1993

[54] ELECTRON MICROSCOPE

[75] Inventor: Hiroyuki Kobayashi, Mito, Japan

[73] Assignee: Hitachi, Ltd., Tokyo, Japan

[21] Appl. No.: 797,028

[22] Filed: Nov. 25, 1991

[30] Foreign Application Priority Data

Nov. 27, 1990 [JP] Japan ................... 2-320831

[51] Int. Cl.$^5$ .................................... H01J 37/26
[52] U.S. Cl. .............................. 250/311; 250/397
[58] Field of Search ................. 250/311, 397, 398

[56] References Cited

U.S. PATENT DOCUMENTS

| | | | |
|---|---|---|---|
| 4,531,057 | 7/1985 | Kobayashi | 250/311 |
| 4,680,469 | 7/1987 | Nomura et al. | 250/311 |
| 4,698,503 | 10/1987 | Nomura | 250/311 |
| 4,788,425 | 11/1988 | Kobayashi | 250/311 |

FOREIGN PATENT DOCUMENTS 0145089 6/1985 European Pat. Off. .
0263487 4/1988 European Pat. Off. .
62-143351 6/1987 Japan .

*Primary Examiner*—Paul M. Dzierzynski
*Assistant Examiner*—Kiet T. Nguyen
*Attorney, Agent, or Firm*—Antonelli, Terry, Stout & Kraus

[57] ABSTRACT

An electron microscope in which at individual coordinates on image memories, the difference between image data obtained before an objective lens current or an accelerating voltage is changed and image data obtained after the current or voltage is changed is determined, an approximate function indicative of the relation between coordinates on the image memories and the difference is calculated, and coordinates on the image memories at which the difference exhibits a minimum value on the basis of the approximate function is determined through arithmetic operation to settle the coordinates as the current (voltage) center.

6 Claims, 3 Drawing Sheets

ELECTRON MICROSCOPE

BACKGROUND OF THE INVENTION

The present invention relates to electron microscopes and more particularly to an electron microscope suitable for automatic adjustment of the optical axes of a radiation lens system and an image-forming lens system.

Generally, when the optical axis of the radiation lens system is tilted with respect to the optical axis of the image-forming lens system, optical axis adjustment called current axis alignment or voltage axis alignment is conducted.

The current axis alignment is effected by utilizing the fact that when objective lens current is increased or decreased, an enlarged image is moved in the circumferential direction about a certain position (current center) as shown in FIG. 3A, and it is an alignment method wherein the operator finds the current center when the enlarged image is moved in the circumferential direction by increasing or decreasing the objective lens current and the deflector is adjusted such that the current center coincides with the center of view field.

On the other hand, the voltage axis alignment is effected by utilizing the fact that when accelerating voltage of the electron gun is increased or decreased, an enlarged image is moved in the radial direction from a certain position (voltage center) as shown in FIG. 3B) and it is an alignment method wherein the operator finds the voltage center when the enlarged image is moved in the radial direction by increasing or decreasing the accelerating voltage and the deflector is adjusted such that the voltage center coincides with the center of view field.

Incidentally, with axis alignment as such, the enlarged image is blurred as it moves and therefore, accurate finding of the current (voltage) center is difficult to require the operator to have high skill.

To solve such problems, in a prior art, for example, as described in the specification of U.S. Pat. No. 4,788,425, a technique has been proposed wherein as objective lens current or accelerating voltage is increased or decreased, final images are stored in an image memory and integrated or averaged to provide an image which is displayed.

Since through this the operator is allowed to easily find the current center or voltage center in accordance with the degree of blurr of image, axis alignment can be carried out easily and accurately.

Further, in the aforementioned prior art, a technique is also proposed wherein when an image is displayed, a marker is also displayed concurrently and optical axis alignment is effected by making the marker coincident with the current center or voltage center of a final image.

Also, in JP-A-62-143351, a technique is proposed wherein an amount of electric charge irradiated on a specimen is detected and the optical axis is automatically adjusted by moving the lens system in a direction vertical to the optical axis such that the electric charge amount exhibits a maximum value.

In the prior art described in the U.S. Pat. No. 4,788,425 specification, when finding the current center or voltage center, judgment of the operator is needed and therefore automation could not be planned.

Also, the prior art described in JP-A-62-143351 faced a problem that because of the need of a detector for detection of the electric charge amount, the construction is complicated.

In addition, in order to detect the position at which the electric charge amount exhibits a maximum value, the lens system has to be sufficiently scanned in the direction vertical to the optical axis, raising a problem that much time is needed.

SUMMARY OF THE INVENTION

An object of the invention is to solve the aforementioned prior art problems and to provide an electron microscope capable of effecting, with a simplified construction, axis adjustment automatically within a short period of time.

To accomplish the above object, according to the invention, at individual coordinates on image memories, the difference between image data before objective lens current or accelerating voltage is changed and image data after the changing is finished, and an approximate function indicative of the relation between coordinates on the image memories and the difference is calculated. Then, coordinates on the image memory at which the difference exhibits a minimum value on the basis of the approximate function are determined through arithmetic operation to settle the coordinates as the current (voltage) center.

At coordinates (i, j) on an m×n image memory [$1 \leq i \leq m$, $1 \leq j \leq n$], difference data between image data for a desired objective lens current (or accelerating voltage) and image data after the objective lens current (or accelerating voltage) is changed are represented by Dij, and an approximate function Dij=F(i, j) indicative of the relation between coordinates (i, j) and the difference data Dij is determined. Then, coordinates at which the approximate function F(i, j) assumes a minimum value coincide with the current (voltage) center and therefore, the current (voltage) center can always be determined accurately regardless of the degree of skill of the operator.

DESCRIPTION OF THE PREFERRED EMBODIMENT

Figure 1:
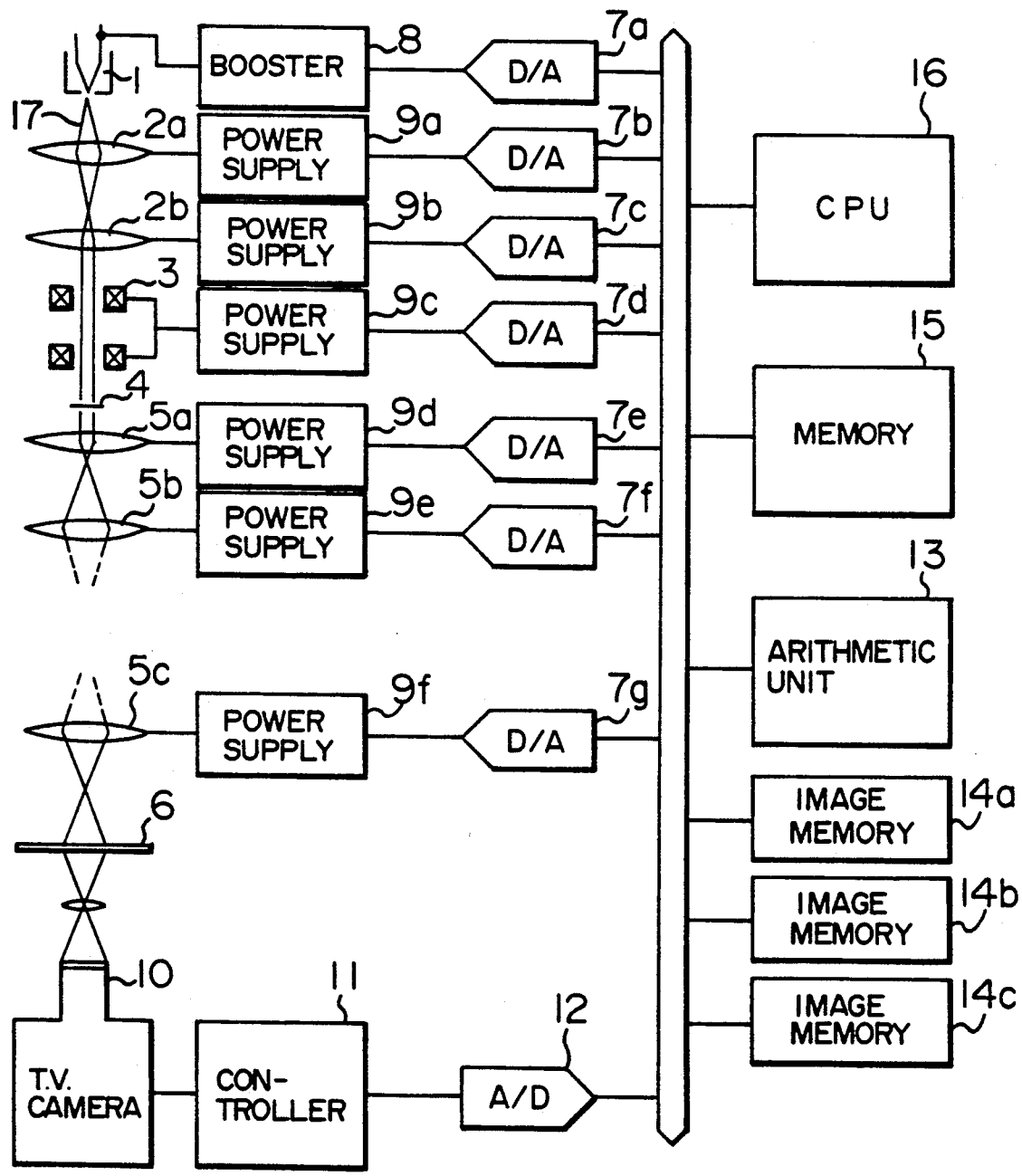
FIG. 1 is a block diagram of an embodiment of the invention.

The basic concept of the axis alignment according to the present invention will first be described by referring to an example of current axis alignment.

In the invention, at individual coordinates (i, j) on an image memory, individual image data Sij for a desired objective lens current are represented by Sij, individual image data after the objective lens current is changed are represented by Tij and individual difference data (Sij−Tij) are represented by Dij, and an approximate function Dij=F(i, j) indicative of the relation between coordinates (i, j) and difference data Dij is first determined as follows.

Namely, when a three-dimensional function z=F(x, y) is introduced, F(x, y) is generally expressed by the following equation (1):

$$F(x, y) = a_1 x + a_2 x^2 + a_3 x^3 + \ldots + \tag{1}$$

$$+ b_1y + b_2y^2 + b_3y^3 + \ldots + c$$

Then, in order to determine coefficients $a_1, a_2, \ldots, b_1, b_2, \ldots, c$, $$\Delta Dij = F(i, j) - Dij \qquad (2)$$

is calculated in respect of individual coordinates (i, j) and values of the coefficients $a_1, a_2, \ldots b_1, b_2, \ldots c$ which make $\Sigma(\Delta Dij)^2$ exhibit a minimum value is calculated by solving, for example, normal equations of the method of least squares indicated by the following equations (3) to (5):

$$\Sigma \Delta Dij \cdot \frac{\partial \Delta Dij}{\partial a_1} = \Sigma \Delta Dij \cdot \frac{\partial \Delta Dij}{\partial a_2} \qquad (3)$$

$$= \Sigma \Delta Dij \cdot \frac{\partial \Delta Dij}{\partial a_3}$$

$$= 0$$

$$\Sigma \Delta Dij \cdot \frac{\partial \Delta Dij}{\partial b_1} = \Sigma \Delta Dij \cdot \frac{\partial \Delta Dij}{b_2} \qquad (4)$$

$$= \Sigma \Delta Dij \cdot \frac{\partial \Delta Dij}{b_3}$$

$$= 0$$

$$\Sigma \Delta Dij \cdot \frac{\partial \Delta Dij}{\partial c} = 0 \qquad (5)$$

As described previously, since the difference data Dij between image data Sij and image data Tij become substantially zero at the current center and increase at they go away from the current center, coordinates at which the function F(i, j) assumes a minimum value are coordinates of the current center.

Accordingly, when the approximate function F(i, j) is determined in the manner described as above, the function F(i, j) is partially differentiated with i and j as shown in the following equations (6) and (7) to determine coordinates at which the approximate function F(i, j) assumes the minimum value:

$$\frac{\partial F(i, j)}{\partial i} = 0 \qquad (6)$$

$$\frac{\partial F(i, j)}{\partial j} = 0 \qquad (7)$$

In the present invention, moving amounts dX and dY of the current center corresponding to control amounts $\delta X$ and $\delta Y$ by a deflector 3 are experimentally determined in advance. When the current center is determined as described above to show that the deviation between the current center and the center of view field is represented by $\Delta X$ and $\Delta Y$, the deflector 3 will be controlled by a control amount $\delta X \cdot \Delta X/dX$ in relation to the X axis and by a control amount $\delta Y \cdot \Delta Y/dY$ in relation to the Y axis so that the axis alignment may be carried out automatically.

Figure 2:
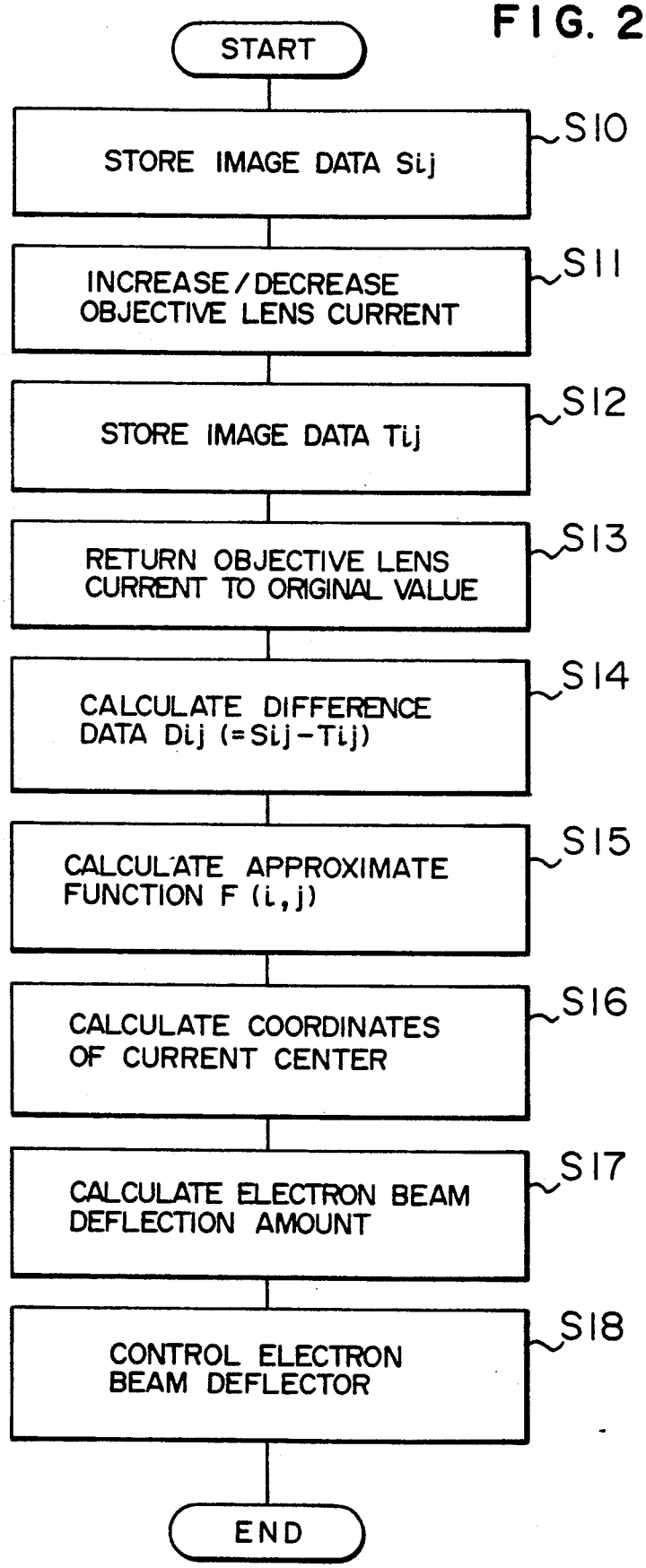
FIG. 2 is a flow chart for explaining the operation of FIG. 1.
Figure 3A:
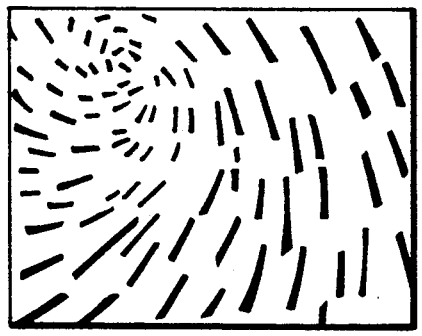
FIGS. 3A and 3B are diagrams for explaining current axis alignment and voltage axis alignment.
Figure 3B:
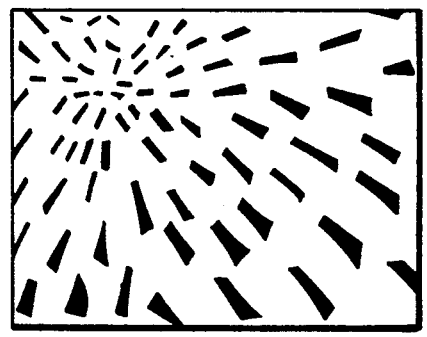

FIG. 1 is a block diagram showing the main part of an electron microscope according to an embodiment of the invention and FIG. 2 is a flow chart for explaining its operation.

In the figure, an electron beam 17 emitted from an electron gun 1 is focused by a first condenser lens 2a and a second condenser lens 2b which constitute a radiation lens system and is then deflected by the deflector 3 so as to be irradiated on a specimen 4.

The electron beam is transmitted through the specimen 4 and enlarged by an objective lens 5a, n intermediate lens 5b and projection lens 5c which constitute an image-forming lens system, to form a final image on a fluorescent plate 6.

The thus formed final image is imaged by a television camera 10 and converted into a video signal through a controller 11. This video signal is digitized by an A/D converter 12 and stored as m×n image data in image memories 14a to 14c through a bus 80.

An output signal of a D/A converter 7a is boosted by a booster circuit 8 to supply an accelerating voltage to the electron gun 1. Lens currents of the electron lenses 2a, 2b, 5a, 5b and 5c are supplied from power supply circuits 9a, 9b, 9d 9e and 9f respectively controlled by output signals of D/A converters 7b, 8c, 7e, 7f and 7g. A deflection current of the deflector 3 is supplied from a power supply circuit 9c controlled by an output signal of a D/A converter 7d. The respective D/A converters 7a to 7g are connected to the bus 80 together with a CPU 16, a memory 15 and an arithmetic unit 13.

Stored in the memory 15 are various control programs for the electron microscope and a program for determining the moving amounts dX and dY of current center corresponding to the control amounts $\delta X$ and $\delta Y$ of the deflector 3 and the approximate function F(i, j).

With the above construction, when current axis alignment is carried out, m×n individual image data Sij for a desired objective lens current are stored in step S10 in the image memory 14a, the objective lens current is suitably increased or decreased in step S11, so that an enlarged image is rotated about the current center, and thereafter rotated m×n individual image data Tij are stored in step S12 in the image memory 14b.

In step S13, the objective lens current is returned to the original value and in step S14, the individual image data in the image memory 14b are subtracted from the individual image data in the image memory 14a to calculate difference data Dij (=Sij−Tij) at individual coordinates and the difference data Dij are stored in the image memory 14c.

In step S15, the approximate function F(i, j) is calculated by means of the arithmetic unit 13 controlled by CPU 16 and in step 516, coordinates of the current center are determined on the basis of a minimum value of the approximate function F(i, j).

In Step S17, the deviation represented by $\Delta X$ and $\Delta Y$ between the coordinates of the current center and the central position coordinates of the enlarged image is calculated, and a control amount $\delta X \cdot \Delta X/dX$ of the deflector 3 in relation to the X axis and a control amount $\delta Y \cdot \Delta Y/dY$ in relation to the Y axis are calculated.

In step 18, the CPU 16 controls the deflector 3 on the basis of the aforementioned control amounts to complete the axis alignment.

Since in accordance with the present embodiment the current center is calculated through the arithmetic operation without resort to observation by the operator, there is no need of providing exclusive detectors and in addition, the current (voltage) center can always be determined accurately regardless of the degree of skill of the operator.

If moving amounts dX and dY of the current center corresponding to control amounts $\delta X$ and $\delta Y$ of the deflector 3 are experimentally determined in advance and the deflector is controlled on the basis of the deviation $\Delta X$, $\Delta Y$ between the thus determined current center and the center of view field, then optical axis alignment can be carried out automatically.

In the foregoing embodiment, the invention has been described by referring to the example of current axis alignment but as is clear to those skilled in the art, the invention can also be applied to voltage axis alignment in a similar manner. Further in the foregoing embodiment the invention has been described by way of the transmission electron microscope but it can also be applied to scanning electron microscopes.

As is clear from the foregoing description, the present invention can attain the following effects.

(1) At individual coordinates (i, j) on the image memory, image data for a desired objective lens current are represented by Sij, image data obtained after the objective lens current is changed are represented by Tij and difference data between both the data are represented by Dij; and an approximation function Dij=F(i, j) indicative of the relation between coordinates (i, j) and difference data Dij is determined and the current (voltage) center is determined on the basis of coordinates at which the approximate function F(i, j) exhibits a minimum value. Therefore, the current (voltage) center can always be determined accurately regardless of the degree of skill of the operator.

(2) When moving amounts of the current (voltage) center corresponding to control amounts of the deflector are experimentally determined in advance and the deflector is controlled on the basis of the deviation $\Delta X$, $\Delta Y$ between the current (voltage) center determined on the basis of coordinates at which the approximate function F(i, j) exhibits a minimum value and the center of view field, optical axis alignment can be carried out automatically.

I claim:

1. An electron microscope in which optical axis alignment is effected by deflecting an electron beam such that any one of the current center and voltage center coincides with the center of view field, characterized in that said electron microscope comprises:
   a radiation lens system for focusing the electron beam emitted from an electron source;
   an image-forming lens system for enlarging the electron beam transmitted through a specimen to form an enlarged image;
   electron beam deflection means for alignment of the optical axis of said radiation lens system with that of said image-forming lens system;
   image memories for storing video data converted from the enlarged image;
   difference detection means for determining at least one of the difference between image data at individual coordinates obtained before and after image data are changed by increasing or decreasing an excitation current of an objective lens and the difference between image data at individual coordinates obtained before and after image data are changed by increasing or decreasing an accelerating voltage for the electron beam;
   function calculation means for calculating an approximate function indicative of the relation between individual coordinates on said image memories and said difference; and
   current/voltage center detection means for determining coordinates on said image memories at which the difference assumes a minimum value, on the basis of said approximate function.

2. An electron microscope according to claim 1 characterized in that said optical axis detection means determines a minimum value by partially differentiating said approximate function with respect to coordinates and calculates coordinates which assume said minimum value.

3. An electron microscope according to claim 2 characterized in that said electron microscope further comprises:
   memory means for storing a unit moving amount of current/voltage center corresponding to a unit control amount of said electron beam deflection means;
   means for detecting a deviation amount between the center position of view field and said current/voltage center; and
   means for controlling said electron beam deflection means such that the center position of view field coincides with said current/voltage center, on the basis of said unit moving amount and deviation amount.

4. An electron microscope according to claim 1 characterized in that said electron microscope further comprises:
   memory means for storing a unit moving amount of current/voltage center corresponding to a unit control amount of said electron beam deflection means;
   means for detecting a deviation amount between the center position of view field and said current/voltage center; and
   means for controlling said electron beam deflection means such that the center position of view field coincides with said current/voltage center, on the basis of said unit moving amount and deviation amount.

5. An electron microscope according to claim 1, further comprising means responsive to the current/voltage center detection means for controlling the electron beam deflection means so as to effect alignment of the optical axis of said radiation lens system with that of said image-forming lens system by deflecting the electron beam such that any one of the current center and voltage center coincides with the center of view field.

6. An electron microscope according to claim 1, wherein said difference detection means determines the difference between image data obtained before and after image data are changed by increasing or decreasing an accelerating voltage for the electron beam.

* * * * *